(12) United States Patent
Kanazawa et al.

(10) Patent No.: US 10,840,428 B2
(45) Date of Patent: Nov. 17, 2020

(54) SCALABLE QUANTUM DEVICES WITH VERTICAL COAXIAL RESONATORS

(71) Applicant: INTERNATIONAL BUSINESS MACHINES CORPORATION, Armonk, NY (US)

(72) Inventors: Naoki Kanazawa, Kanagawa (JP); Masao Tokunari, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/295,473

(22) Filed: Mar. 7, 2019

(65) Prior Publication Data

US 2020/0287117 A1  Sep. 10, 2020

(51) Int. Cl.
*H01L 39/04* (2006.01)
*G06N 10/00* (2019.01)
*H01L 39/22* (2006.01)

(52) U.S. Cl.
CPC .......... *H01L 39/045* (2013.01); *G06N 10/00* (2019.01); *H01L 39/223* (2013.01)

(58) Field of Classification Search
CPC ......... H01L 39/045; H01L 39/223–226; H01L 39/00–2496; H01L 21/76891; H01L 23/49888; H01L 23/53285; H01L 27/18; H01L 35/225; G06N 10/00; H03K 3/38; H03K 17/92; H03K 19/195–1958
See application file for complete search history.

(56) References Cited

U.S. PATENT DOCUMENTS

| | | | | |
|---|---|---|---|---|
| 10,305,015 B1* | 5/2019 | Brink | .................. | H01L 25/0657 |
| 10,380,495 B2* | 8/2019 | Leek | ..................... | H01L 39/223 |
| 2016/0364653 A1* | 12/2016 | Chow | ..................... | H01L 25/04 |
| 2017/0062692 A1 | 3/2017 | Dial et al. | | |
| 2018/0137430 A1 | 5/2018 | Chow et al. | | |
| 2019/0049495 A1* | 2/2019 | Ofek | .................. | G01R 33/1284 |
| 2020/0012961 A1* | 1/2020 | Kelly | .................. | H01L 23/5225 |

OTHER PUBLICATIONS

G. Wendin, "Quantum Information Processing with Superconducting Circuits: a Review", Rep. Prog. Phys., Oct. 2017.
Sarah Sheldon et al., "Procedure for Systematically Turning up Crosstalk in the Cross Resonance Gate", Phys. Rev. A, Mar. 2016.
Nicholas T. Bronn et al., "High Coherence Plane Breaking Packaging for Superconducting Qubits", Quantum Sci. Technol., Sep. 2017.
D. Rosenberg et al., "3D integrated superconducting qubits", nature partner journals, Oct. 2017.
Thomas G. McConkey, "Extensible Architecture for Superconducting Quantum Computing", UWSpace. http://hdl.handle.net/10012/13464, Jul. 2018.
J.H. Béjanin et al., "Three-Dimensional Wiring for Extensible Quantum Computing: The Quantum Socket", American Physical Society, Oct. 2016.

* cited by examiner

*Primary Examiner* — Shahed Ahmed
(74) *Attorney, Agent, or Firm* — Tutunjian & Bitetto, P.C.; Abdy Raissinia

(57) ABSTRACT

Quantum computing devices include a chip carrier that has a conductive carrier body and one or more readout resonators in the conductive carrier body. Each readout resonator has a center conductor and a coaxial dielectric layer. A quantum chip is on the chip carrier and includes one or more qubits positioned over respective readout resonators.

20 Claims, 4 Drawing Sheets

SCALABLE QUANTUM DEVICES WITH VERTICAL COAXIAL RESONATORS

BACKGROUND

Technical Field

The present invention generally relates to quantum computing architectures and, more particularly, to the use of vertical coaxial resonators to couple to qubits.

Description of the Related Art

Certain quantum computing architectures make use of superconducting islands as qubits. The qubits are coupled to quantum buses that are used to facilitate computation and resonators that are used to read the state of the qubits. However, noise from the surrounding environment can quickly cause decoherence, disrupting the ability of the quantum computer to function. In addition, the quantum architecture is often laid out in two dimensions, and it can be challenging to implement the processing architecture and input/output architecture for a quantum computer in a limited amount of available area.

SUMMARY

A quantum computing device includes a chip carrier that has a conductive carrier body and one or more readout resonators in the conductive carrier body. Each readout resonator has a center conductor and a coaxial dielectric layer. A quantum chip is on the chip carrier and includes one or more qubits positioned over respective readout resonators.

A quantum computing device includes a chip carrier that has a conductive carrier body and readout resonators in the conductive carrier body. Each readout resonator has a superconducting center conductor and a coaxial dielectric layer. A quantum chip is on the chip carrier, with an air gap between the chip carrier and the quantum chip. The quantum chip includes transmon qubits positioned over respective readout resonators and one or more quantum buses, each positioned between respective pairs of qubits.

A quantum computing device includes a chip carrier that has a grounded conductive carrier body and readout resonators in the conductive carrier body. Each readout resonator has a superconducting center conductor and a coaxial dielectric layer. A quantum chip is on the chip carrier, with an air gap between the chip carrier and the quantum chip. The quantum chip includes transmon qubits positioned over respective readout resonators and one or more quantum buses formed in a surface code lattice with the qubits. Each quantum bus is positioned between respective pairs of qubits.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
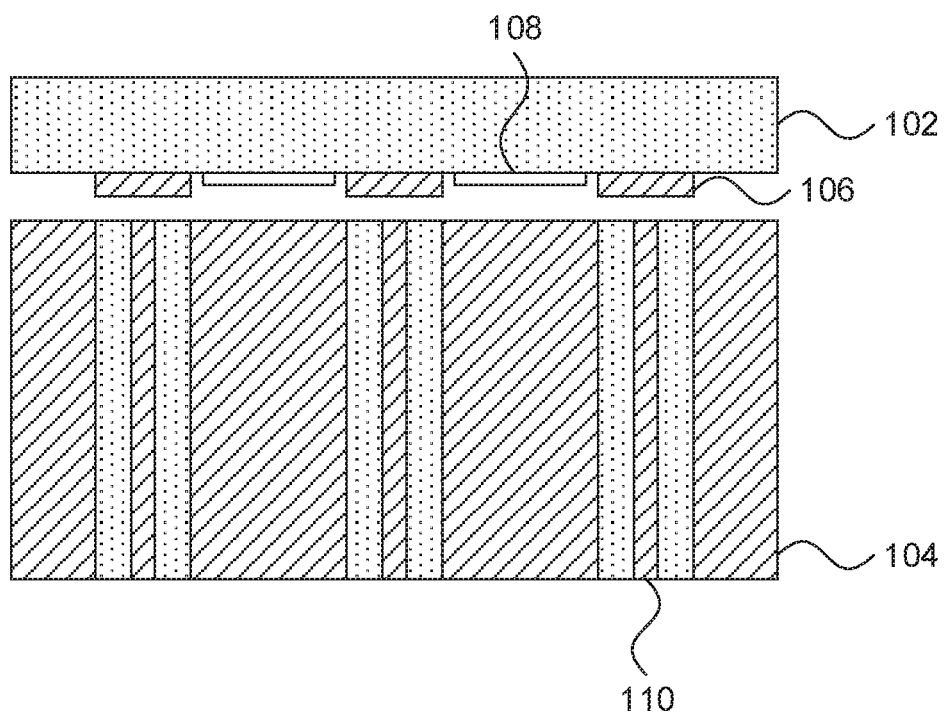
FIG. 1 is a cross-sectional diagram illustrating a quantum computing architecture that employs coaxial readout resonators that are positioned perpendicular to a plane of a quantum chip in accordance with an embodiment of the present invention.

Embodiments of the present invention provide resonators that are located in the body of a layer that underlies the qubits. The resonators have a perpendicular orientation relative to the plane of the qubits and the quantum buses and are positioned outside of that plane, so that the relatively large resonators do not interfere with the layout of the qubits and buses. In addition, the body of the underlying layer that houses the resonators can be formed from a grounded material that reduces the interference that can result from coupling between the resonators and the quantum buses and between the resonators and the surrounding environment. It is specifically contemplated that the resonators can have a coaxial structure that is tuned to a particular resonant frequency, thereby providing a high-Q readout and to suppress coupling between the resonator and other nearby structures.

Quantum computing architectures rely on quantum mechanical effects to quickly perform calculations that would be particularly time consuming to conventional computing architectures. Whereas conventional digital computing architectures rely on encoding data as binary values—represented as being either 1s or 0s, quantum computing architectures use qubit structures that can store information as a superposition of both states, which can be understood as having a measure of each state, 0 and 1, simultaneously. In general, the state of the qubit corresponds to some physical state of the system or structure. Examples of qubit states may relate to polarization of photons, electron spins, nuclear spins, internal states of atoms, ions or molecules, states of quantized electric circuit such as a superconducting circuit, etc.

The quantum state of the qubit can take values of $|0\rangle$, $|1\rangle$, or the linear combination of both, which is known as superposition. The computational basis corresponds to the two levels $|0\rangle$ and $|1\rangle$, which correspond to the following vectors:

$$|0\rangle = \begin{pmatrix} 1 \\ 0 \end{pmatrix}, |1\rangle = \begin{pmatrix} 0 \\ 1 \end{pmatrix}.$$

A superposition is a weighted sum or difference of two or more states. The qubit can be in an arbitrary quantum state, denoted $|\psi\rangle$, which can be any superposition of the basis vectors, $|\psi\rangle = \alpha|0\rangle + \beta|1\rangle$. The superposition quantities $\alpha$ and $\beta$ are complex numbers; both obey $|\alpha|^2 + |\beta|^2 = 1$. If a qubit in some state $|\psi\rangle$ is measured, the result 0 is obtained with probability $|\alpha|^2$, and the result 1 is obtained with the complementary probability $|\beta|^2$. A quantum measurement takes any superposition state of the qubit, and projects the state to either the state $|0\rangle$ or the state $|1\rangle$, with a probability determined from the superposition quantities.

The states of the qubits in a quantum computer are described using wave functions, which are mathematical representations of the quantum state of the system. Coherence is present in a quantum computing system when a definite phase relation exists between the states of the quantum computer—e.g., a phase relation between the quantum wave functions that describes the qubit states. Quantum computers rely on coherence to operate. A loss of quantum coherence corresponds to a loss of information to the outside environment and is destructive to the computations being performed. Coherence is maintained by isolation of the qubits in the quantum computer from outside noise—communication with outside elements by any mechanism, such as thermal interactions and electromagnetic interactions, cause the coherence of the system to degrade in a process called quantum decoherence. Quantum decoherence can be interpreted as the loss of information from the quantum system into its surrounding environment.

While some forms of coupling, such as thermal coupling, can be addressed by isolation of the quantum computer from its environment, for example mechanical vibration isolation and thermal isolation, other forms of coupling, such as electromagnetic coupling, are more challenging. One particular form of electromagnetic coupling arises from charge noise, which is difficult to shield. Charge fluctuations occur constantly in most materials, as the electrons in their orbits around atoms cause ephemeral regions of relatively positive and negative charge. This charge noise arises from the materials themselves and couples electromagnetically with the atoms of the qubits. Charge noise can thus cause decoherence to occur, as the electromagnetic interactions cause unpredictable changes to the states of the qubits.

The time that it takes for decoherence to occur is a measure of the viability of a quantum computing architecture. Macroscopic objects generally decohere very quickly, as they have many interactions with their surrounding environments. The longer a quantum computer can maintain coherence, the more feasible it is to perform useful computations with that quantum computer. Finding ways to delay decoherence is therefore a significant goal in the realm of quantum computing.

The present embodiments therefore employ structures that are robust against quantum decoherence, in particular through the use of superconducting transmon structures. The use of low-temperature superconductors minimizes the loss of coherence resulting from thermal coupling, while the structure of a transmon is robust against charge noise for the reasons described below. The present embodiments provide read access to the transmon qubits using out-of-plane coaxial resonators that couple with an electrode of each transmon qubit, freeing space on the quantum chip for use by the qubits and quantum buses.

Referring now to the drawings in which like numerals represent the same or similar elements and initially to FIG. 1, a cross-sectional diagram of an exemplary quantum computing architecture is shown. A quantum chip 102 is shown in relation to a chip carrier 104. In some embodiments, the quantum chip 102 is physically mounted to the chip carrier by posts or some other structure to maintain a gap between the two, while in other embodiments the two structures are held apart. The quantum chip 102 carries a set of qubits 106 that are embedded in the chip 102 and that communicate with one another by quantum buses 108. The structure of the qubits 106 will be described in greater detail below.

The chip carrier 104 is formed from a grounded conductor or superconductor and has vertical resonators 110 formed within it in positions that correspond to the positions of qubits 106. It is specifically contemplated that coaxial resonator structures can be used, as described in greater detail below, but any appropriate resonator structure can be used instead. A coaxial structure suppresses microwave radiation and provides a high-Q resonator, while the surrounding, grounded bulk material protects the qubits 106 from environmental noise and thermal radiation. This prevents interference between readout resonators and prevents the readout resonators from interfering with the function of the quantum buses 108.

In some exemplary embodiments, the quantum buses 108 can be implemented as superconducting waveguides that are positioned coplanar with the qubits 106. In some embodiments, the quantum buses 108 can have an exemplary length of about 8 mm and L/S of 10/6 µm, which provides a resonant frequency between about 6 GHz and about 7 GHz.

The resonators 110 capacitively couple with their respective qubits 106 across an air gap or some appropriate dielectric barrier. The height of the air gap can be any appropriate size, with heights on the order of hundreds of micrometer being specifically contemplated. If an air gap is used instead of a solid dielectric material, it is contemplated that the air gap can be maintained by protrusions that extend from the quantum chip 102 or the chip carrier 104 and contact the other structure. It is specifically contemplated that such protrusions can be formed along the perimeter of the quantum chip 102 or the chip carrier 104 to prevent the protrusions from interfering with the operation of the qubits 106 and quantum buses 108.

The quantum buses 108 enable quantum operations between the qubits 106 that they connect. A "quantum operation" represents an instruction or a command to be applied to one or more quantum qubits, or a combination of instructions or commands in a programming language for quantum computing. For example, a "quantum operation" may represent a quantum gate, or a combination of quantum gates that can be treated as a single function. In some embodiments, the quantum buses can be directional or non-directional.

Quantum operations can be categorized into single-qubit operations and multi-qubit operations. Examples of a single-qubit operation include, but are not limited to, a unitary gate, a Pauli X/Y/Z gate, a Hadamard gate, and a measurement gate. A single-qubit operation can be performed on a single qubit 106 without using a quantum bus 108. Examples of a multi-qubit operation include, but are not limited to, a controlled unitary gate, a controlled not (CNOT) gate, and a swap gate. Multi-qubit operations are performed on multiple qubits 106 (two qubits in these examples) connected by quantum buses 108 (a single coupling in these two-qubit examples). For example, a pair of qubit states, b0 and b1, stored in a pair of physical qubits 106 that are connected by a quantum bus 108, can be swapped by a swap operation. In this manner, computations can be performed across multiple qubits on a quantum chip.

Figure 2:
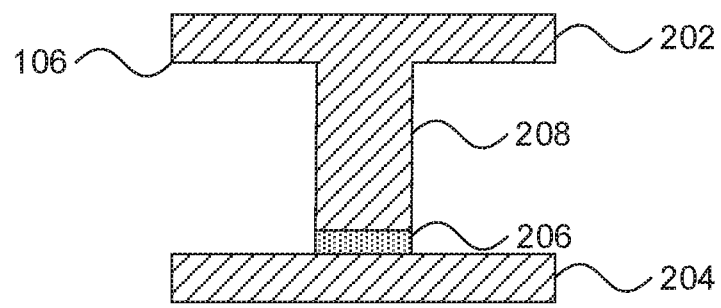
FIG. 2 is a cross-sectional diagram illustrating a transmon qubit structure that includes two electrodes connected by a post that has a Josephson junction in accordance with an embodiment of the present invention.

Referring now to FIG. 2, a cross-sectional diagram of a single qubit 106 is shown. The present embodiments are specifically directed to the use of a transmon for the qubit 106, but it should be understood that other types of qubit structures can be used instead if they couple with resonators for reading and computation.

This particular structure of a qubit is known as a transmon, where a superconducting island electrode 202 is connected to a superconducting reservoir electrode 204 by a post 208 that includes a junction 206. The junction, known as a Josephson junction, is a non-superconducting barrier between the two superconducting electrodes. In some embodiments, the junction 206 can be formed from a non-superconducting material, such as an insulator or non-superconducting metal, while in other embodiments the junction 206 can be formed by a physical constriction of the superconducting electrodes that weakens the superconductivity at the point of contact. The maximum thickness of the junction 206 will depend on the material used, with non-superconducting metals providing a higher maximum thickness than insulators.

In one specific embodiment, the island electrode 202 and the reservoir electrode 204 can be formed from aluminum, while the junction 206 can be formed from aluminum oxide (e.g., $Al_2O_3$). It should be understood that any other appropriate superconducting material can be used instead of aluminum in the present embodiments. Examples of superconducting materials include type-I superconductors, such as cadmium, gallium, indium, lanthanum, palladium, lead, rhenium, tin, tantalum, thorium, and thallium, type-II superconductors, such as diamond, niobium, vanadium, and a variety of other compound materials, and iron- and copper-based superconductors. In each case, the superconducting material has a critical temperature, below which it exhibits superconducting properties and above which those superconducting properties rapidly break down.

The qubit 106 thereby exhibits the Josephson effect, whereby a supercurrent exists without any voltage being applied. The qubit 106 holds a number of Cooper pairs in the island electrode 202 to represent the quantum state of the qubit 106. Cooper pairs move between the island electrode 202 and the reservoir electrode 204 to change the state of the qubit 106. This change of state is triggered by the interaction with quantum buses 108. The state of the qubit 106 is read by observing the state of the resonators 110.

A shunt capacitance is present between the island electrode 202 and the reservoir electrode 204. Charge noise describes fluctuations in the gate charge of a qubit, which can cause the qubit to lose coherence. Coherence relates to the ability of the qubit to perform a computing function, as the loss of coherence causes the state of the qubit to become uncertain. The charged particles that establish the state of a qubit are electrically coupled with the charged particles in their surrounding environment. As the charged particles interact with their surroundings, the uncertainty in their state increases and the accuracy of any calculations being performed decreases. The structure of the transmon is resistant to the effects of charge noise, making it particularly useful in quantum computing applications. In particular, while the intrinsic capacitance of the Josephson junction 206 itself is quite small, the presence of a large parallel capacitance between the electrodes, known as a shunting capacitance, makes the structure much more stable.

In some exemplary embodiments, the diameter of the electrodes 202 and 204 can be about 300 µm. In other embodiments, the area of the electrodes 202 and 204 can be less than about one square micrometer. It should be understood that any appropriate electrode shape can be used, including, circular, polygonal, and irregular shapes. In some embodiments, the post 208 can have a length of about 500 µm to tune the qubit 106 to a resonant frequency of about 4 GHz to about 6 GHz. The cross-sectional area of the junction 206 can be about 1 $\mu m^2$, but it should be understood that the post 208 and junction 206 need not have a circular cross section, nor do they need to have a consistent thickness across their length. In some embodiments, the post 208 may have a shape that is narrower at one end than the other.

Thus, in some specific embodiments, the transmon cubits 106 can be programmed by applying microwave pluses to a cubit from a respective resonator 110 or quantum bus 108, causing cooper pairs to move to the island electrode 202, from the reservoir electrode 204, or the reverse, thereby changing the state of the qubit.

Figure 3:
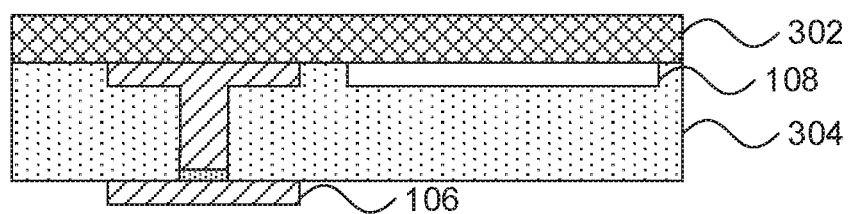
FIG. 3 is a cross-sectional diagram illustrating a portion of a quantum chip that shows a qubit in relationship to a superconducting quantum bus in accordance with an embodiment of the present invention.

Referring now to FIG. 3, a more detailed view of a portion of the quantum chip 102 is shown. This portion of the quantum chip 102 includes a single qubit 106 and a single quantum bus 108 for simplicity. The structure of the quantum chip 102 includes a substrate layer 302 and a passivating dielectric layer 304. The substrate layer 302 can be formed from any appropriate material including, for example, a silicon-containing material, sapphire, glass, etc. The passivating dielectric layer 304 can be formed from any appropriate material with a low tangent loss, such as intrinsic silicon, to minimize energy dissipation and, thus, decoherence. The reservoir island 204 is exposed outside the passivating dielectric layer 304 to facilitate coupling with an adjacent resonator 110.

In addition to the shunt capacitance between the island electrode 202 and the reservoir electrode 204, a gate capacitance is present between the island electrode 202 of the qubit 106 and the adjacent quantum bus(es) 108. The exact values of these capacitances will depend on the distances between the respective structures and the dielectric constant of the material between them.

Figure 4:
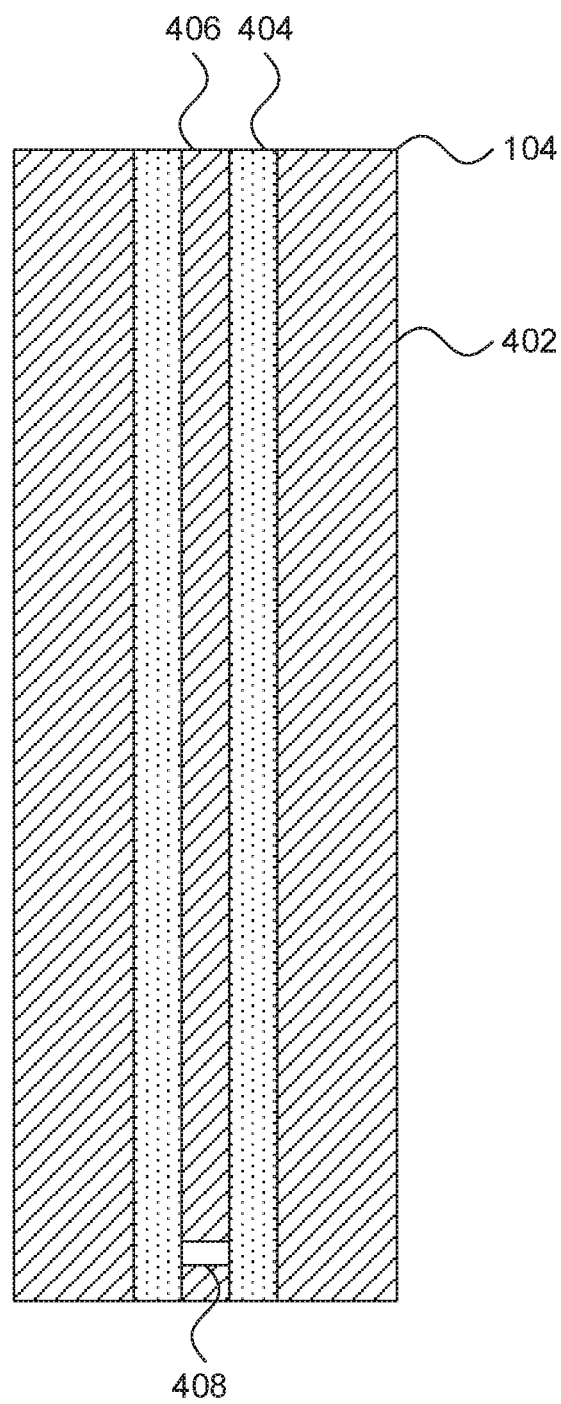
FIG. 4 is a cross-sectional diagram illustrating a portion of a chip carrier that includes a readout resonator formed with a coaxial structure embedded having a solid center conductor in accordance with an embodiment of the present invention.

Referring now to FIG. 4, a more detailed view on part of chip carrier 104 is shown. The body of the chip carrier 104 is made up of a grounded material 402. It is specifically contemplated that the grounded material 402 can be formed from aluminum, but it should be understood that any other type of superconducting material or any appropriate non-superconducting, conductive material, such as copper, can be used instead.

The resonator is formed with a coaxial structure, including a center conductor 406 and a dielectric insulator 404. It is specifically contemplated that the central conductor 406 can be formed from a superconducting material, the same material as is used in the chip carrier body 402, or any other appropriate superconducting or appropriate non-superconducting, conductive material, such as copper. The dielectric insulator 404 can be formed from, e.g., a polytetrafluoroethylene (PTFE) material, a polyethylene material, or any other appropriate dielectric material. An air gap 408 is positioned to set the resonant frequency of the resonator.

In one specific embodiment, the central conductor 406 can have a diameter of about 310 µm and the dielectric insulator 404 can have a diameter of about 1 mm, establishing a characteristic impedance of about 48Ω. In general, the length of the resonator can be about half of a resonant wavelength. In this embodiment, the air gap 408 can be positioned at about 15 mm from the top of the chip carrier 104 to produce a resonant frequency of about 6.5 GHz. If a material with a higher dielectric constant is used for the dielectric insulator 404, then the length of the central conductor 406 can be decreased. This coaxial structure provides extremely low crosstalk between adjacent resonators 110, in some experiments less than −40 dB.

Figure 5:
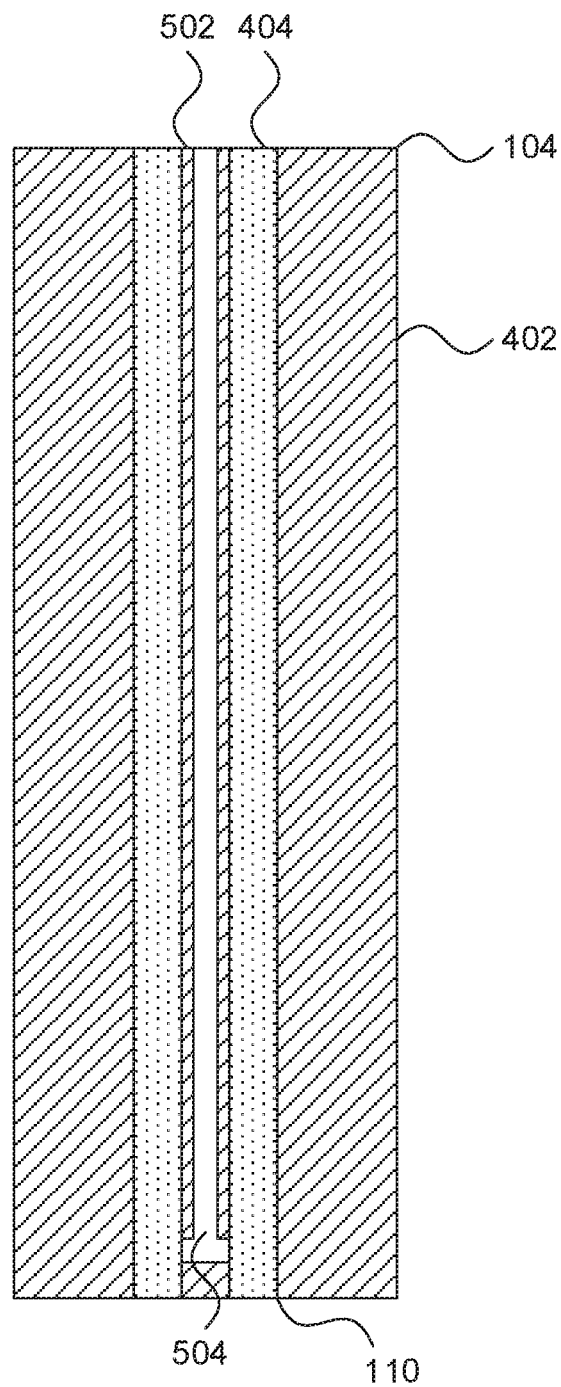
FIG. 5 is a cross-sectional diagram illustrating a portion of a chip carrier that includes a readout resonator formed with a coaxial structure embedded having a hollow center conductor in accordance with an embodiment of the present invention.

Referring now to FIG. 5, another embodiment of the resonators 110 is shown. As shown in FIG. 4 above, the resonators 110 are positioned within a grounded, conductive body 402. In this embodiment, rather than having a solid central conductor, a hollow central conductor 502 is used. Because the resonators 110 are cooled to exhibit superconductivity, a thin sidewall (e.g., hundreds of nanometers thick) is sufficient to support microwave transmission, as electromagnetic fields will not penetrate through the central conductor 502.

The resonators 110 can be added to the chip carrier 104 in a variety of ways. In some embodiments, holes can be drilled into a block of conductive material at an appropriate diameter. It is specifically contemplated that the chip carrier 104 can first be cooled down to a same temperature as will be used during operation, so that any thermal contraction of the material will be consistent with the circumstances that will occur during operation. It is specifically contemplated that the holes may have a depth between about 100 mm and about 500 mm and may have a diameter of about 1 mm. The holes are drilled into the block of conductive material at positions that correspond to the positions of the qubits 106 in the quantum chip 102, such that the qubits 106 will align with the resonators 110 when the quantum chip 102 is assembled with the chip carrier 104. Lengths of solid-core resonator can then be inserted into the holes to complete the chip carrier.

In other embodiments, where hollow resonators are used, the resonators can be formed by coating the surfaces of a tube of insulator dielectric material with a conductive material. The coating can be performed using electroplating or any appropriate form of conformal deposition such as, e.g., atomic layer deposition or chemical vapor deposition. In such embodiments, the insulator and hollow center conductor are inserted into the chip carrier 104 together.

In still other embodiments, the resonators can be formed in place. After the holes have been formed by, e.g., drilling or an appropriate anisotropic etch, such as a reactive ion etch, a layer of dielectric insulator material can be conformally formed on sidewalls of the holes to any appropriate thickness. A center conductor can then be formed on inner sidewalls of the layer of dielectric insulator material by any appropriate conformal deposition process. The center conductor can be formed to completely fill the remaining space in the holes or can, alternatively, be formed to a thickness that only partially fills the remaining space, leaving hollow resonators.

Figure 6:
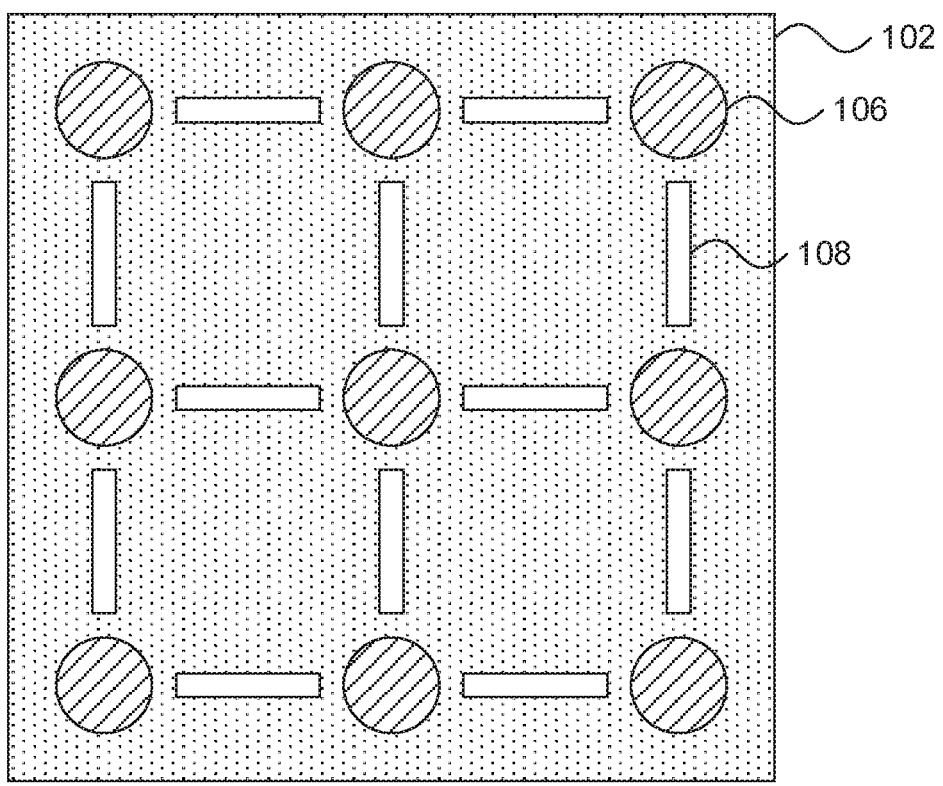
FIG. 6 is a bottom-up view of quantum chip that shows multiple qubits and quantum buses in relation to one another in a surface code lattice in accordance with an embodiment of the present invention.

Referring now to FIG. 6, a bottom-up view of the quantum chip 102 is shown. This view shows a set of qubits 106 and quantum buses 108 laid out in relation to one another on the surface of the quantum chip 102 to form a surface code lattice. The particular arrangement of qubits 106 and quantum buses 108 can correspond to optimize a particular computation or can be set in a more general-purpose configuration. Because the readout resonators 110 are out of the plane of the quantum chip 102, the surface code lattice can be constructed with few constraints and can be adapted to any appropriate configuration for the quantum computing application at hand. Respective qubits 106 are connected to one another by the quantum buses 106, which are resonators that couple with different qubits 106 to perform quantum computation operations.

Having described preferred embodiments of scalable quantum devices with vertical coaxial resonators (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A quantum computing device, comprising:
    a chip carrier that includes:
        a conductive carrier body; and
        one or more readout resonators in the conductive carrier body, each readout resonator having a hollow center conductor and a coaxial dielectric layer; and
    a quantum chip on the chip carrier that includes one or more qubits positioned over respective readout resonators.

2. The quantum computing device of claim 1, wherein the conductive carrier body is grounded.

3. The quantum computing device of claim 1, wherein the one or more qubits are transmons that include an island electrode, a reservoir electrode, and a Josephson junction between the island electrode and the reservoir electrode.

4. The quantum computing device of claim 3, wherein the island electrode and reservoir electrode of each qubit are formed from aluminum and wherein the Josephson junction of each qubit is formed from aluminum oxide.

5. The quantum computing device of claim 1, wherein the carrier body is formed from a conductive metal.

6. The quantum computing device of claim 1, wherein the carrier body is formed from a superconducting material.

7. The quantum computing device of claim 1, wherein the chip carrier includes a plurality of readout resonators and wherein the quantum chip includes a plurality of qubits, further comprising one or more quantum buses, each positioned between respective pairs of qubits.

8. The quantum computing device of claim 7, wherein the qubits and the quantum buses on the quantum chip form a surface code lattice.

9. The quantum computing device of claim 1, wherein the chip carrier and quantum chip are spaced apart, leaving an air gap between the qubits and the respective readout resonators.

10. A quantum computing device, comprising:
    a chip carrier that includes:
        a conductive carrier body; and
        a plurality of readout resonators in the conductive carrier body, each readout resonator having a hollow superconducting center conductor and a coaxial dielectric layer; and
    a quantum chip on the chip carrier, with an air gap between the chip carrier and the quantum chip, that includes a plurality of transmon qubits positioned over respective readout resonators and one or more quantum buses, each positioned between respective pairs of qubits, wherein the one or more qubits each include an island electrode, a reservoir electrode, and a Josephson junction between the island electrode and the reservoir electrode.

11. The quantum computing device of claim 10, wherein the conductive carrier body is grounded.

12. The quantum computing device of claim 10, wherein the carrier body is formed from a conductive metal.

13. The quantum computing device of claim 10, wherein the carrier body is formed from a superconducting material.

14. The quantum computing device of claim 10, wherein the qubits and the quantum buses on the quantum chip form a surface code lattice.

15. A quantum computing device, comprising:
   a chip carrier that includes:
      a conductive carrier body; and
      one or more readout resonators in the conductive carrier body, each readout resonator having a hollow center conductor and a coaxial dielectric layer; and
   a quantum chip on the chip carrier that includes one or more qubits positioned over respective readout resonators, wherein each of the one or more qubits is a transmon that includes an island electrode, a reservoir electrode, and a Josephson junction between the island electrode and the reservoir electrode.

16. The quantum computing device of claim 15, wherein the conductive carrier body is grounded.

17. The quantum computing device of claim 15, wherein the one or more qubits are transmons that include an island electrode, a reservoir electrode, and a Josephson junction between the island electrode and the reservoir electrode.

18. The quantum computing device of claim 17, wherein the island electrode and reservoir electrode of each qubit are formed from aluminum and wherein the Josephson junction of each qubit is formed from aluminum oxide.

19. The quantum computing device of claim 15, wherein the chip carrier includes a plurality of readout resonators and wherein the quantum chip includes a plurality of qubits, further comprising one or more quantum buses, each positioned between respective pairs of qubits.

20. The quantum computing device of claim 19, wherein the qubits and the quantum buses on the quantum chip form a surface code lattice.

* * * * *